United States Patent
Fukuoka et al.

(10) Patent No.: US 8,007,924 B2
(45) Date of Patent: Aug. 30, 2011

(54) ORGANIC ELECTROLUMINESCENT DEVICE AND DISPLAY USING SAME

(75) Inventors: Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 487 days.

(21) Appl. No.: 10/562,124

(22) PCT Filed: Jun. 16, 2004

(86) PCT No.: PCT/JP2004/008456
§ 371 (c)(1), (2), (4) Date: Dec. 23, 2005

(87) PCT Pub. No.: WO2005/009087
PCT Pub. Date: Jan. 27, 2005

(65) Prior Publication Data
US 2007/0007882 A1    Jan. 11, 2007

(30) Foreign Application Priority Data

Jul. 2, 2003 (JP) .................................. 2003-190630

(51) Int. Cl.
*H01L 51/54* (2006.01)
(52) U.S. Cl. ........ 428/690; 428/197; 313/504; 313/506; 252/301.16; 257/40; 257/88
(58) Field of Classification Search .................. 428/690, 428/917; 313/504, 506; 257/40, E51.044
See application file for complete search history.

(56) References Cited

U.S. PATENT DOCUMENTS

| | | | | |
|---|---|---|---|---|
| 5,757,139 A * | 5/1998 | Forrest et al. | ............. | 315/169.3 |
| 5,932,895 A | 8/1999 | Shen et al. | | |
| 6,107,734 A * | 8/2000 | Tanaka et al. | .................. | 313/506 |
| 6,143,434 A * | 11/2000 | Okada | ........................... | 428/690 |
| 6,215,245 B1 * | 4/2001 | Mori | .............................. | 313/506 |
| 6,420,031 B1 * | 7/2002 | Parthasarathy et al. | .... | 428/411.1 |
| 6,717,358 B1 * | 4/2004 | Liao et al. | ..................... | 313/504 |
| 6,872,472 B2 | 3/2005 | Liao et al. | ..................... | 428/690 |
| 7,158,161 B2 | 1/2007 | Gyoutoku et al. | ............ | 347/130 |
| 7,420,203 B2 | 9/2008 | Tsutsui et al. | .................. | 257/40 |
| 7,473,923 B2 | 1/2009 | Tsutsui et al. | .................. | 257/40 |
| 2003/0071569 A1 | 4/2003 | Chung et al. | .................. | 313/512 |
| 2003/0127967 A1 * | 7/2003 | Tsutsui et al. | ................ | 313/498 |
| 2003/0170491 A1 * | 9/2003 | Liao et al. | ..................... | 428/690 |
| 2003/0189401 A1 * | 10/2003 | Kido et al. | ..................... | 313/504 |
| 2004/0161192 A1 | 8/2004 | Hamano et al. | ................. | 385/31 |
| 2004/0227460 A1 * | 11/2004 | Liao et al. | ..................... | 313/506 |
| 2005/0029933 A1 | 2/2005 | Liao et al. | ..................... | 313/504 |
| 2005/0264174 A1 * | 12/2005 | Liao et al. | ..................... | 313/500 |
| 2009/0045738 A1 | 2/2009 | Tsutsui et al. | ................ | 313/504 |

FOREIGN PATENT DOCUMENTS

| EP | 1 318 553 A2 | 6/2003 |
|---|---|---|
| JP | 11-312584 | 11/1999 |
| JP | 11-312585 | 11/1999 |
| JP | 2002-367784 | 12/2002 |
| JP | 2003-045676 | 2/2003 |
| JP | 2003-272860 | 9/2003 |
| JP | 2004-095546 | 3/2004 |

OTHER PUBLICATIONS

English machine translation of JP 2002/367784 A.*
Matsumoto, Toshio, et al., Multiphoton Emission OLED: Structure and Property, IDW'03, Dec. 2003, pp. 1285-1288.
Nakata, Takeshi, "Denka Hasseiso to shite Denka Ido Sakutai o Yusuru Multiphoton Emission Yuki EL Soshi," Dai 63 Kai Oyo Butsurigaku Kankei Rengo Koenkai Koen Yokoshu, 2002, p. 1165.
Fukase, Akio, "ITO o Inkyoku to shite Mochiita Top Emission Yuki EL Soshi," Dai 49 Kai Oyo Butsurigaku Kankei Rengo Koenkai Koen Yokoshu, 2002, p. 1308.
Kido, J. et al, "Invited Paper: High Efficiency Organic EL Devices having Charge Generation Layers," 2003 SID International Symposium, Baltimore, Maryland, May 20, 2003, SID 03 Digest, vol. XXXIV, p. 964.
Pfeiffer, M. et al, "A low drive voltage, transparent, metal-free n-i-p. electrophosphorescent light emitting diode," Organic Electronics, 4 (2003), pp. 21-26.

* cited by examiner

*Primary Examiner* — Callie Shosho
*Assistant Examiner* — Michael H Wilson
(74) *Attorney, Agent, or Firm* — Steptoe & Johnson LLP (57) ABSTRACT

An organic electroluminescent device including: at least two or more emitting layers (4), (8) between an anode (10) and a cathode (2), and an intermediate electrode layer (6) being interposed between emitting layers (4), (8), the intermediate electrode layer (6) being a single layer or a multilayer structure of a plurality of layers, at least one of the layers (6) including a semiconductive material having a resistivity of 0.001 to 10,000 Ω·cm. The device and a display using the same have a high efficiency and long life time.

8 Claims, 1 Drawing Sheet

Fig. 1

ORGANIC ELECTROLUMINESCENT DEVICE AND DISPLAY USING SAME

CLAIM OF PRIORITY

This application claims priority under 35 USC 371 to International Application No. PCT/JP2004/008456, filed on Jun. 16, 2004, which claims priority to Japanese Patent Application No. 2003-190630, filed on Jul. 2, 2003, the entire contents of which are hereby incorporated by reference.

TECHNICAL FIELD

The invention relates to an organic electroluminescent device (organic EL device) and display using the same.

BACKGROUND ART

An organic EL device has rapidly made progress as a luminescent device with a high efficiency in recent years. The organic EL device advantageously emits light with a high brightness since it is a current-type element. However it also has the following disadvantage because of being a current-type element; current increases at a high brightness, and power consumption thus decreases due to the electric resistance of wiring.

In order to solve the disadvantage, various improvements for enhancing current efficiency have been carried out.

For example, the technique is disclosed that a plurality of organic EL devices are stacked and light emitted from each of the devices is combined, thereby enhancing current efficiency. Specifically U.S. Pat. No. 5,932,895 discloses a method of stacking RGB elements, but the method does not enhance luminous efficiency. JP-A-H11-312585, JP-A-H11-312584 and JP-A-2003-45676 disclose a structure of stacking a plurality of elements with an excellent efficiency; however they do not have a satisfactory life time.

As stated above, there remain many problems concerning the high efficiency of an organic EL device at the present.

The invention has been made in view of the above-mentioned problems and an object thereof is to provide an organic EL device with a high efficiency and long life time.

In order to attain the object, the inventors conducted various studies through which they have found that it is effective to arrange an intermediate electrode layer made of a semiconductive material with a certain resistivity between emitting layers of an organic EL device and have made the invention based on their findings.

DISCLOSURE OF THE INVENTION

The invention provides the following organic EL device and the like.

1. An organic electroluminescent device comprising:
    at least two or more emitting layers between an anode and a cathode, and
    an intermediate electrode layer being interposed between emitting layers,
    the intermediate electrode layer being a single layer or a multilayer structure of a plurality of layers, at least one of the layers comprising a semiconductive material having a resistivity of 0.001 to 10,000 Ω·cm.
2. The organic electroluminescent device according to 1, wherein the semiconductive material is a chalcogenide.
3. The organic electroluminescent device according to 1, wherein the semiconductive material comprises a chalcogenide and an alkali metal.
4. The organic electroluminescent device according to 1, wherein the semiconductive material is a conductive oxide.
5. The organic electroluminescent device according to 4, wherein the conductive oxide contains a transition metal.
6. The organic electroluminescent device according to 5, wherein the conductive oxide containing a transition metal is at least one oxide selected from the group of $NbO_x$, $LaO_x$, $NdO_x$, $SmO_x$, $EuO_x$, $MoO_x$, $ReO_x$, $WO_x$, $OsO_x$, $IrO_x$ and $PtO_x$ wherein x is 0.2 to 5.
7. The organic electroluminescent device according to 1, wherein the semiconductive material comprises an acceptor that is a conductive oxide containing a transition metal, and a donor that is an alkali metal and/or an alkaline earth metal.
8. The organic electroluminescent device according to 7, wherein the acceptor is at least one oxide selected from the group of $Li_xTi_2O_4$, $Li_xV_2O_4$, $Er_xNbO_3$, $La_xTiO_3$, $Sr_xVO_3$, $Ca_xCrO_3$, $Sr_xCrO_3$, $A_xMoO_3$ and $AV_2O_5$ wherein A is K, Cs, Rb, Sr, Na, Li or Ca, and x is 0.2 to 5.
9. The organic electroluminescent device according to 1, wherein the semiconductive material is a conductive organic radical salt represented by the following formula (1):

wherein D represents a molecule or an atom having a donor nature, A represents a molecule or an atom having an acceptor nature, y represents an integer of 1 to 5, and z represents an integer of 1 to 5.

10. The organic electroluminescent device according to 9, wherein D is a molecule represented by the following formulas (2) to (9):

-continued (8)

(9)

wherein $A^3$s independently represent an oxygen atom, a sulfur atom or a selenium atom, and $A^4$s independently represent a sulfur atom or a selenium atom, wherein $A^1$s independently represent a carbon atom, a sulfur atom, a selenium atom or a tellurium atom, $A^2$s independently represent a carbon atom, a sulfur atom, a selenium atom, a tellurium atom or an oxygen atom, $R^1$s independently represent a hydrogen atom or a $C_{1\ to\ 50}$ alkyl group, $R^2$s independently represent a $C_{1\ to\ 50}$ alkyl group or a $C_{1\ to\ 50}$ thioalkyl group, and $R^3$s independently represent a hydrogen atom, a $C_{1\ to\ 50}$ thioalkyl group or a $C_{1\ to\ 50}$ selenoalkyl group.

11. The organic electroluminescent device according to 9 or 10, wherein A is a molecule represented by the following formulas (10) to (13):

(10)

wherein $Ar^1$ represents the following organic groups that may be substituted with halogen, (11)

(12)

(13)

wherein $A^5$s independently represent a carbon atom, a sulfur atom, a selenium atom, a tellurium atom or an oxygen atom, $A^6$s independently represent a carbon atom, a sulfur atom, a selenium atom or a tellurium atom, Ms independently represent a nickel atom, a palladium atom, a platinum atom or a zinc atom, $R^4$s independently represent a hydrogen atom, a halogen atom, a $C_{1\ to\ 50}$ alkyl group or a $C_{1\ to\ 50}$ alkoxy group.

12. The organic electroluminescent device according to 11, wherein D is an alkali metal or an alkaline earth metal.

13. An organic electroluminescent device comprising:
at least one or more emitting layers between an anode and a cathode,
the cathode comprising at least one metal oxide, and the cathode having a light transmittance of 80% or more.

14. The organic electroluminescent device according to 13, further comprising a sealing film made of a transparent material on the cathode, the sealing film having an area larger than the area of an emitting region formed of an overlap between the cathode and the anode.

15. The organic electroluminescent device according to 14, wherein the transparent material is an oxide, a nitride or an oxygen nitride of at least one element selected from the group of Si, Ge, Mg, Ta, Ti, Zn, Sn, In, Pb and Bi.

16. The organic electroluminescent device according to 14, wherein the transparent material is an oxide, a nitride or an oxygen nitride of at least one element selected from the group of Mo, V, Cr, W, Ni, Co, Mn, Ir, Pt, Pd, Ce, Pr, Nd, Sm, Eu, Gd, Tb, Dy, Er and Yb.

17. The organic electroluminescent device according to any one of 13 to 16, wherein the cathode comprises 2 to 20 wt % of a donor.

18. An organic electroluminescent device comprising:
one or more emitting layers between an anode and a cathode, and
bipolar charge injection layers being interposed between the anode and at least one of the emitting layers and between the cathode and at least one of the emitting layers.

19. The organic electroluminescent device according to 18, wherein the bipolar charge injection layers comprise at least one donor and at least one acceptor.

20. The organic electroluminescent device according to 19, wherein the acceptor is an oxide or a nitride of a transition metal.

21. The organic electroluminescent device according to 19 or 20, wherein the donor is an alkali metal and/or an alkaline earth metal.

22. The organic electroluminescent device according to any one of 18 to 21, wherein the bipolar charge injection layers comprise a mixture of at least one element single substance selected from the group of Cs, Li, Na and K; and at least one oxide selected from the group of $MoO_x$, $VO_x$, $ReO_x$, $RuO_x$, $WO_x$, $ZnO_x$, $TiO_x$, and $CuO_x$ wherein x is 0.5 to 5.

23. The organic electroluminescent device according to 22, wherein the content of the element is 2 to 20 wt %.

24. The organic electroluminescent device according to 1, wherein the semiconductive material has a resistivity of not less than 0.001 Ω·cm but less than 100 Ω·cm.

25. An organic electroluminescent device comprising:
at least one or more emitting layers between an anode and a cathode,
the cathode comprising at least one donor and at least one acceptor comprising a metal oxide, and the cathode having a light transmittance of 80% or more.

26. The organic electroluminescent device according to any one of 1 to 12 and 24, wherein the intermediate electrode layer is a bipolar charge injection layer.

27. The organic electroluminescent device according to any one of 18 to 23, 25 and 26, wherein the anode or the cathode is the same as the bipolar charge injection layer.

28. A display comprising a screen comprising the organic electroluminescent device according to any one of 1 to 27.

BEST MODES FOR CARRYING OUT THE INVENTION

Organic EL devices (A) to (C) of the invention are described below.

(A) An organic EL device comprising: at least two or more emitting layers between an anode and a cathode, and an intermediate electrode layer being interposed between emitting layers, the intermediate electrode layer being a single layer or a multilayer structure of a plurality of layers, at least one of the layers comprising a semiconductive material having a resistivity of 0.001 to 10,000 Ω·cm (B) An organic EL device comprising: at least one or more emitting layers between an anode and a cathode, the cathode comprising at least one donor and at least one acceptor comprising a metal oxide, and, the cathode having a light transmittance of 80% or more (C) An organic EL device comprising one or more emitting layers between an anode and a cathode, and bipolar charge injection layers being interposed between the anode and at least one of the emitting layers and between the cathode and at least one of the emitting layers First, the organic EL device (A) of the invention will be described.

[Intermediate Electrode Layer]

The organic EL device (A) comprises at least two or more emitting layers between an anode and a cathode, and an intermediate electrode layer interposed between emitting layers, the intermediate electrode layer comprising a semiconductive material having a resistivity of 0.001 to 10,000 Ω·cm.

The intermediate electrode layer can generate both electrons and holes since it comprises a semiconductive material with the above resistivity. Thus it can sufficiently supply carriers to either one of the two emitting layers on both the surfaces thereof.

Figure 1:
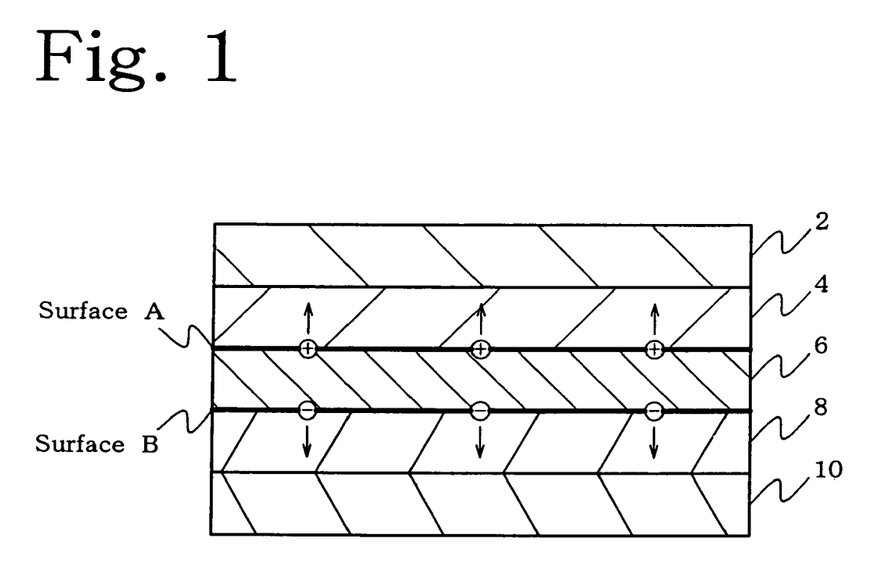
FIG. 1 is a view for explaining the function of an intermediate electrode layer.

As shown in FIG. 1, an intermediate electrode layer 6 injects holes from a surface A contact with an emitting layer 4 on a cathode 2 side, while it injects electrons from a surface B contact with an emitting layer 8 on a anode 10 side.

The intermediate electrode layer has good contact with the emitting layers and the other organic layers and the organic EL device of the invention can thus have a longer life time than conventional organic EL devices.

When a material of the intermediate electrode layer has too small a resistivity, current tends to leak. When it has too large a resistivity, voltage increases at the driving time. Preferred then is a semiconductive material having a resistivity of 0.001 to 10,000 Ω·cm, particularly preferably 0.01 to 100 Ω·cm. The intermediate electrode layer preferably has a thickness of 0.1 to 100 nm to function as a thin film. Too thick the thickness thereof may cause an increase in driving voltage.

The material making up the intermediate electrode layer is not limited so long as it is a semiconductive material with the above resistivity. Electrical conductive oxides and electrical conductive organic radical salts are preferred.

The conductive oxides preferably contain a transition metal.

An example thereof is at least one oxide selected from the group of $NbO_x$, $LaO_x$, $NdO_x$, $SmO_x$, $EuO_x$, $MoO_x$, $ReO_x$, $WO_x$, $OsO_x$, $IrO_x$ and $PtO_x$ wherein x is 0.2 to 5.

A preferred conductive organic radical salt is represented by the following formula (1):

$$D_y A_z \tag{1}$$

wherein D represents a molecule or an atom having a donor nature, A represents a molecule or an atom having an acceptor nature, y represents an integer of 1 to 5, and z represents an integer of 1 to 5.

In the formula (1), D is preferably a molecule represented by the following formulas (2) to (9):

wherein $A^1$s independently represent a carbon atom, a sulfur atom, a selenium atom or a tellurium atom, $A^2$s independently represent a carbon atom, a sulfur atom, a selenium atom, a tellurium atom or an oxygen atom, $R^1$s independently represent a hydrogen atom or a $C_{1\ to\ 50}$ alkyl group, $R^2$s independently represent a $C_{1\ to\ 50}$ alkyl group or a $C_{1\ to\ 50}$ thioalkyl group, and $R^3$s independently represent a hydrogen atom, a $C_{1\ to\ 50}$ thioalkyl group or a $C_{1\ to\ 50}$ selenoalkyl group.

In $R^1$ to $R^3$, the $C_{1\ to\ 50}$ alkyl group includes methyl, ethyl, propyl, isopropyl, n-butyl, s-butyl, isobutyl, t-butyl, n-pentyl, n-hexyl, n-heptyl, n-octyl hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, cyclopropyl, cyclobutyl, cyclopentyl, cyclohexyl, 4-methylcyclohexyl, 1-adamantyl, 2-adamantyl, 1-norbornyl and 2-norbornyl groups. The $C_{1\ to\ 50}$ thioalkyl group and $C_{1\ to\ 50}$ selenoalkyl group include groups that are the above alkyl groups bonded to a sulfur atom, and groups that are the above alkyl groups bonded to a selenium atom, respectively.

Specific examples of molecules represented by the above formulas (2) to (9) include TTT (tetrathiotetracene), TPBP (tetraphenylbipyranylidene) and the following compounds:

D is preferably an alkali metal such as Li, K, Na, Rb or Cs, an alkaline earth metal such as Ca, and La and $NH_4$. They are preferably used as combined when A is an organic material.

In the above formula (1), A is a molecule represented by the following formulas (10) to (13):

(10)

wherein $Ar^1$ represents the following organic groups that may be substituted with halogen, wherein $A^3$s independently represent an oxygen atom, a sulfur atom or a selenium atom, and $A^4$s independently represent a sulfur atom or a selenium atom, (11)
(12)

(13)

wherein $A^5$s independently represent a carbon atom, a sulfur atom, a selenium atom, a tellurium atom or an oxygen atom, $A^6$s independently represent a carbon atom, a sulfur atom, a selenium atom or a tellurium atom, Ms independently represent a nickel atom, a palladium atom, a platinum atom or a zinc atom, $R^4$s independently represent a hydrogen atom, a halogen atom, a $C_{1\ to\ 50}$ alkyl group or a $C_{1\ to\ 50}$ alkoxy group.

The $C_{1\ to\ 50}$ alkyl group of $R^4$ is the same as the above, the halogen thereof includes chlorine and bromine, and the $C_{1\ to\ 50}$ alkoxy group includes the above alkyl group bonded to an oxygen atom.

Specific examples of molecules represented by the above formulas (10) to (13) include the following organic materials:

DCNQI

OCNAQ

As A, preferred are $TaF_6$, $AsF_6$, $PF_6$, $ReO_4$, $ClO_4$, $BF_4$, $Au(CN)_2$, $Ni(CN)_4$, $CoCl_4$, $CoBr$, $I_3$, $I_2Br$, $IBr_2$, $AuI_2$, $AuBr_2$, $Cu_5I_6$, $CuCl_4$, $Cu(NCS)_2$, $FeCl_4$, $FeBr_4$, $MnCl_4$, $KHg(SCN)_4$, $Hg(SCN)_5$, $NH_4(SCN)_4$ and the like.

The semiconductive material preferably comprises an acceptor that is a conductive oxide containing a transition metal, and a donor that is an alkali metal and/or an alkaline earth metal.

As the acceptor, preferred are at least one oxide selected from the group of $Li_xTi_2O_4$, $Li_xV_2O_4$, $Er_xNbO_3$, $La_xTiO_3$, $Sr_xVO_3$, $Ca_xCrO_3$, $Sr_xCrO_3$, $A_xMoO_3$, $AV_2O_5$ wherein A is K, Cs, Rb, Sr, Na, Li or Ca, and x is 0.2 to 5.

As the alkali metal and alkaline earth metal, the above-mentioned metals are preferred.

The semiconductive material is preferably a chalcogenide. As the chalcogenide, preferred are ZnSe, ZnS, TaS, TaSe, ZnO and the like.

The semiconductive material also preferably comprises a chalcogenide and alkali metal. Preferred examples include LiZnSe, LiZnSi, LiZnO and LiInO.

In the invention, the intermediate electrode layer may be a single layer or a multilayer structure of a plurality of layers (two or three and more layers). In the case where the intermediate electrode layer is a multilayer structure, at least one layer thereof may be a layer comprising a semiconductive material. The intermediate electrode layer may be a multilayer structure of a plurality of layers that comprise semiconductive materials.

[Emitting Layer]

An emitting layer of an organic EL device possesses the following functions:

(a) an injection function; which enables to inject holes from an anode or hole-injecting layer and to inject electrons from a cathode or electron-injecting layer, when an electric field is impressed, (b) a transport function; which transports injected electric charge (electrons and holes) with an electric field's power, and (c) an emitting function; which provides a re-combination site for electrons and holes to emit light.

There may be a difference in ease of injection between holes and electrons, and also a difference in transport capacity that is represented by mobilities of holes and electrons. However, moving one of the electric charges is preferred.

As methods of forming this emitting layer, known methods such as vacuum deposition, spin coating and LB technique can be applied.

An emitting layer is particularly preferably a molecule-deposited film.

The term "molecule-deposited film" here means a thin film that is formed by depositing a material compound in a vapor phase and a film formed by solidifying a material compound in a solution state or liquid state. Usually this molecule-deposited film can be distinguished from a thin film formed by the LB technique (a molecule-accumulated film) by differences in agglutination structure and higher dimension structure, and functional differences caused thereby.

As disclosed in JP-A-57-51781, an emitting layer can also be formed by dissolving a binder such as resins and material compound in a solvent to make a solution and forming a thin film therefrom by spin coating and so on.

The host materials used in the emitting layer may be a material known as a luminescent material having a long life time. It is desirable to use, as the host material of the luminescent material, a material represented by a general formula (14), but the host material is not limited to the following material:

$$(Ar^2 \!\!\!-\!\!\!)_m\!\!-\!\!(X^1)_n \tag{14}$$

wherein $Ar^2$ is an aromatic ring with 6 to 50 nucleus carbon atoms, $X^1$ includes substituted or unsubstituted aromatic groups with 6 to 50 nucleus carbon atoms, substituted or unsubstituted aromatic heterocyclic groups with 5 to 50 nucleus carbon atoms, substituted or unsubstituted alkyl groups with 1 to 50 carbon atoms, substituted or unsubstituted alkoxy groups with 1 to 50 carbon atoms, substituted or unsubstituted aralkyl groups with 1 to 50 carbon atoms, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbon atoms, substituted or unsubstituted styryl groups, halogen groups, a cyano group, a nitro group, and a hydroxyl group, m is an integer of 1 to 5, and n is an integer of 0 to 6.

Specific examples of $Ar^2$ include phenyl, naphthyl, anthracene, biphenylene, azulene, acenaphthylene, fluorene, phenanthrene, fluoranthene, acephenanthrylene, triphenylene, pyrene, chrysene, naphthacene, picene, perylene, penthaphene, pentacene, tetraphenylene, hexaphene, hexacene, rubicene, coronene, and trinaphthylene rings.

Preferred examples thereof include phenyl, naphthyl, anthracene, acenaphthylene, fluorene, phenanthrene, fluoranthene, triphenylene, pyrene, chrysene, perylene, and trinaphthylene rings.

More preferred examples thereof include phenyl, naphthyl, anthracene, fluorene, phenanthrene, fluoranthene, pyrene, chrysene, and perylene rings.

In the substituent $X^1$, examples of the substituted or unsubstituted aromatic groups with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted aromatic heterocyclic groups with 5 to 50 nucleus carbon atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, and 4-t-butyl-3-indolyl groups.

Examples of the substituted or unsubstituted alkyl groups with 1 to 50 carbon atoms include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, cyclopropyl, cyclobutyl, cyclopentyl, cyclohexyl, 4-methylcyclohexyl, 1-adamanthyl, 2-adamanthyl, 1-norbornyl, and 2-norbornyl groups.

The substituted or unsubstituted alkoxy groups with 1 to 50 carbon atoms are groups represented by —OY. Examples of Y include the same substituent as the above-mentioned alkyl group.

Examples of the substituted or unsubstituted aralkyl groups with 1 to 50 carbon atoms include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl groups.

The substituted or unsubstituted aryloxy groups with 5 to 50 nucleus atoms are represented by —OY'. Examples of Y' include the same substituent as the above-mentioned aromatic and aromatic heterocyclic groups.

The substituted or unsubstituted arylthio groups with 5 to 50 nucleus atoms are represented by —SY", and examples of Y" include the same substituent as the above-mentioned aromatic and aromatic heterocyclic groups.

The substituted or unsubstituted carboxyl groups with 1 to 50 carbon atoms are represented by —COOY''', and examples of Y''' include the same substituent as the above-mentioned Y.

Examples of the substituted or unsubstituted styryl groups include 2-phenyl-1-vinyl, 2,2-diphenyl-1-vinyl, and 1,2,2-triphenyl-1-vinyl groups.

Examples of the halogen groups include fluorine, chlorine, bromine and iodine.

m is preferably an integer of 1 to 2, and n is preferably an integer of 0 to 4.

$Ar^2$s may be the same as or different from each other when m is 2 or more, and $X^1$s may be the same as or different from each other when n is 2 or more.

Moreover a dopant may be added in the emitting layer. The dopant used may be a dopant known as a luminescent material having a long life time. It is preferred to use, as the dopant material of the luminescent material, a material represented by a general formula (15), but, the host material is not limited to the following material:

(15)

wherein $Ar^3$ to $Ar^5$ are each a substituted or unsubstituted aromatic group with 6 to 50 nucleus carbon atoms, or a substituted or unsubstituted styryl group; and p is an integer of 1 to 4.

In the substituents $Ar^3$ to $Ar^5$, examples of the substituted or unsubstituted aromatic group with 6 to 50 nucleus carbon atoms and the substituted or unsubstituted styryl group each include the same substituent as the above-mentioned $X^1$ represented by the general formula (14).

$Ar^4$s, as well as $Ar^5$s, may be the same as or different from each other when p is 2 or more.

[Anode]

The anode of the organic thin film EL device plays a role for injecting holes into its hole transporting layer or emitting layer. The anode effectively has a work function of 4.5 eV or more. Specific examples of the material of the anode in the invention include indium tin oxide alloy (ITO), zinc tin oxide alloy (IZO), tin oxide (NESA), gold, silver, platinum, and copper.

The anode can be formed by forming these electrode materials into a thin film by vapor deposition, sputtering or the like.

In the invention, in the case where luminescence from the emitting layer is taken out through the anode, the transmittance of the anode to the luminescence is preferably more than 10%. The sheet resistance of the anode is preferably several hundreds $\Omega/\square$ or less. The film thickness of the anode, which is varied in accordance with the material thereof, is usually from 10 nm to 1 µm, preferably from 10 to 200 nm.

[Cathode]

For the cathode, the following may be used: an electrode substance made of a metal, an alloy or an electroconductive compound which has a small work function (4 eV or less), or a mixture thereof. Specific examples of the electrode substance include sodium, sodium-potassium alloy, magnesium, lithium, magnesium/silver alloy, aluminum/aluminum oxide, cesium, calcium, aluminum/lithium alloy, indium, rare earth metals, alkaline chalcogenides and alkaline earth chalcogenides.

This cathode can be formed by making the electrode substance(s) into a thin film by vapor deposition, sputtering or some other method.

In the invention, in the case where luminescence from the emitting layer is taken out through the cathode, it is preferred to make the transmittance of the cathode to the luminescence larger than 10%.

The sheet resistance of the cathode is preferably several hundreds $\Omega/\square$ or less, and the film thickness thereof is usually from 10 nm to 1 µm, preferably from 50 to 200 nm.

Next, the organic EL device (B) of the invention will be described. The anode and emitting layer thereof are similar to those of the organic EL device (A) and the explanation on these is then omitted.

[Top Emission Type]

In the organic EL device (B), light emitted is taken out through a cathode. When driven using TFT (thin film transistor), the aperture ratio of ordinary devices where light is taken out through a substrate is small due to TFT and the like on the substrate and a sufficient luminance cannot be obtained. The technique is then very useful that takes out light from the opposed side to the substrate, that is, from the cathode side, not from the usual substrate side.

Such change in direction of taking out light requires to arrange a transparent electrode such that light to be taken out passes through the transparent electrode. An organic EL device usually uses ITO as a transparent electrode. In order to obtain a good ITO film, the temperature of substrate is needed to raise up to 200° C. or more. However since an organic EL device is made of organic materials, 200° C. changes its layered structure and degrades the device. Consequently ITO cannot be used as an electrode through which light is taken out.

Thus the inventors have made the following cathode.

[Cathode]

The cathode of the organic EL device (B) comprises at least one donor and at least one acceptor made of a metal oxide.

The donor includes alkali metals and alkaline earth metals. The acceptor includes transition metal oxides.

A material containing a donor and an acceptor of metal oxide can efficiently inject electrons as a cathode and has a high transmittance. It is excellently applied in the structure of taking out light through a cathode. For example, a material containing only a donor may have a low transparency although it is excellent in electron injection. A metal oxide is transparent but does not function as a cathode. Thus the mixture of both the materials at optimal concentrations enables to obtain transparency and electron injecting nature. In order to secure transparency, a metal oxide is preferably mixed at higher amounts, preferably 50 wt % or more. If the amount of donor is too small, electrons cannot be injected. Thus 2 to 20 wt % is preferred. The film thickness is preferably 0.1 nm to 10 µm, particularly preferably 0.5 nm to 1 µm to function as a thin film and let current flow.

The lamination of LiF/Al has been known as a cathode to those skilled in the art and widely used. However if LiF and ITO are laminated, the laminate does not function as a cathode with a low efficiency. The laminate LiF/Al/ITO functions as a cathode but the use of Al generates no small influence of interference effect caused by reflection on Al, even if the thickness of Al film is made thin. For this reason, a cathode with a higher transparency is required.

In the case where a metal oxide is used in a cathode, if the thickness is made thick to reduce electrical resistance, its resistivity may decrease. In such the case, the combination with auxiliary wiring enables to reduce electrical resistance generated in a path for supplying current to pixels.

The cathode of the invention is excellent in stability and its half-life at the time of continuous driving is long by the use of a metal oxide.

[Transmittance]

In the organic EL device (B), a cathode has a light transmittance of 80% or more, preferably 90% or more. The transmittance is related to at least light in the wavelength range of a luminescent component of an organic EL device and represents a ratio of intensity between incident light and transmitted light. A higher transmittance or transparency is preferred without reducing a luminous efficiency.

Designing the refractive index and thickness of each layer is very important for enhancing the efficiency of taking out light. If a material which is transparent in the state of a single layer is stacked, light may be reflected on an interface thereof.

[Sealing Film]

The organic EL device (B) preferably comprises a sealing film made of a transparent material on a cathode. The sealing film preferably has an area larger than the area of an emitting region where the cathode and the anode overlap.

The sealing film is to prevent moisture and oxygen contained mainly in the atmosphere from penetrating to an organic EL device. Thus the more a film prevents the penetration thereof, the more preferred. The lower oxygen transmittance, the more preferred, 0.01 ml/m²/day or less being particularly preferred. The lower moisture transmittance, the more preferred, 0.01 ml/m²/day or less being particularly preferred.

Particularly preferred transparent materials constituting the sealing film include oxides, nitrides and oxygen nitrides of Si, Ge, Mg, Ta, Ti, Zn, Sn, In, Pb and Bi. Also preferred are oxides, nitrides and oxygen nitrides of Mo, V, Cr, W, Ni, Co, Mn, Ir, Pt, Pd, Ce, Pr, Nd, Sm, Eu, Gd, Tb, Dy, Er and Yb.

If the thickness of the sealing film is too thin, a sufficient sealing effect may not be obtained. If the thickness thereof is too thick compared with the thickness of a device, leakage may occur in the device by the stress of sealing film. The thickness is then preferably 10 nm to 100 μm, particularly preferably 100 nm to 10 μm. The film can be formed by vapor deposition, sputtering, EB method, CVD method, application and so on, particularly preferably vapor deposition and sputtering.

Sealing is not necessarily effected only by a sealing film. Sealing may be effected by combining a sealing film with another means. Specifically transparent sealing can and plate may use an inorganic transparent material such as grass or quartz, and plastic such as polycarbonates, polyvinyl fluorides or polyethylene.

Next, the organic EL device (C) of the invention will be described. The cathode, anode and emitting layer thereof are similar to those of the organic EL device (A) and the explanation on these is then omitted.

[Bipolar Charge Injection Layer]

A bipolar charge injection layer comprises a material capable of injecting both holes and electrons to an emitting layer. The nature of injecting electrons is generally much different from that of injecting holes. Only metals can generate both electrons and holes in the state of single layer without laminating. In metals, Fermi energy exists in a band of electron energy level. Electrons can thus be excited with a very small energy and there are a number of electrons excited with heat at room temperature. As a result metals can generate a number of electrons and holes. On the other hand, in ordinary organic materials, there is an energy difference of several eV between the levels of electrons and holes. If the Fermi level of metal is matched to one of electron and hole levels, the energy difference from the other level becomes larger. Thus metals are not suitable as a bipolar charge injection layer for the ordinary organic materials.

However the use of a bipolar charge injection layer enables to obtain a sufficient luminous efficiency, e.g., by holding an emitting layer between the same materials. The electron structure of a bipolar charge injection layer has not been specifically elucidated but the inventors have found that both electrons and holes are efficiently injected even by using the same material. If the same material without a bipolar nature is used for hole and electron injection, one of electrons and holes will be excessive, leading to a low current efficiency.

As such a material, preferred are materials containing a donor and an acceptor. Specifically, the acceptor is preferably an oxide or a nitride of a transition metal. The donor is preferably an alkali metal and/or an alkaline earth metal. More preferred are mixtures of at least one element single substance selected from the group of Cs, Li, Na and K; and at least one oxide selected from the group of $MoO_x$, $VO_x$, $ReO_x$, $RuO_x$, $WO_x$, $ZnO_x$, $TiO_x$, and $CuO_x$ wherein x is 0.5 to 5. The mixture ratio of donor to acceptor is not limited so long as the layer has a bipolar nature, but the content of donor is preferably 2 to 20 wt %.

The bipolar charge injection layer is preferably optically transparent. The layer preferably has a thickness of 0.1 nm to 10 μm, particularly preferably 0.5 nm to 1 μm to functions as a thin film and let current flow.

In the invention, the bipolar charge injection layer can be used as an intermediate electrode layer of the organic EL device (A), and a cathode or anode of the organic EL device (C).

Next, the other structure of the organic EL devices (A) to (C) will be described.

[Hole Injecting, Transporting Layer]

The hole injecting, transporting layer is a layer for helping the injection of holes into the emitting layer so as to transport the holes to a light emitting region. The hole mobility thereof is large and the ionization energy thereof is usually as small as 5.5 eV or less. Such a hole injecting, transporting layer is preferably made of a material which can transport holes to the emitting layer at a lower electric field intensity. The hole mobility thereof is preferably at least $10^{-4}$ cm²/V·second when an electric field of, e.g., $10^4$ to $10^6$ V/cm is applied.

The material for forming the hole injecting, transporting layer is not particularly limited so long as the material has the above-mentioned preferred natures. The material can be arbitrarily selected from materials which have been widely used as a hole transporting material in photoconductive materials and known materials used in a hole injecting layer of organic EL devices.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. Nos. 3,717,462, JP-A-54-59143, 55-52063, 55-52064, 55-46760, 55-85495, 57-11350, 57-148749 and 2-311591, and others), stylbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electro-conductive macromolecular oligomers (in particular thiophene oligomers) disclosed in JP-A-1-211399.

As a material of the hole injecting layer, the following can be used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), in particular, the aromatic tertiary amine compounds.

The following can also be used: 4,4'-bis(N-(1-naphthyl)-N-phenylamino)biphenyl (NPD), which has in the molecule thereof two condensed aromatic rings, disclosed in U.S. Pat. No. 5,061,569, and 4,4',4''-tris(N-(3-methylphenyl)-N-phenylamino)triphenylamine (MTDATA), wherein three triphenylamine units are linked to each other in a star-burst form, disclosed in JP-A-4-308688.

Inorganic compounds, such as p-type Si and p-type SiC, as well as the above-mentioned aromatic dimethylidene type compounds listed as the material of the emitting layer can also be used as the material of the hole injecting layer.

The hole injecting, transporting layer can be formed by making the above-mentioned compound(s) into a thin film by a known method, such as vacuum deposition, spin coating, casting or LB technique. The film thickness of the hole injecting, transporting layer is not particularly limited, and is usually from 5 nm to 5 μm. This hole injecting, transporting layer may be a single layer made of one or more out of the above-mentioned materials if this layer contains the compound of the invention in its hole transporting zone. A hole injecting, transporting layer made of a compound different from that in the above-mentioned hole injecting, transporting layer may be stacked thereon.

[Organic Semiconductive Layer]

The organic semiconductive layer is a layer for helping the injection of holes or electrons into the emitting layer, and is preferably a layer having an electroconductivity of $10^{-10}$ S/cm or more. The material of such an organic semiconductive layer may be an electroconductive oligomer, such as thiophene-containing oligomer or arylamine-containing oligomer disclosed in JP-A-8-193191, an electroconductive dendrimer such as arylamine-containing dendrimer.

[Electron Injecting Layer and Electron Transporting Layer]

The electron injecting layer and the electron transporting layer are each a layer for helping the injection of electrons into the emitting layer, and each have a large electron mobility. The adhesion improving layer is a layer made of a material particularly good in adhesion to the cathode among such electron injecting layers.

The material used in these layers is, for example, preferably a metal complex of 8-hydroxyquinoline or a derivative thereof. Specific examples of the above-mentioned metal complex of 8-hydroxyquinoline or derivative include metal chelate oxynoid compounds each containing a chelate of oxine (generally, 8-quinolinol or 8-hydroxyquinoline).

The following materials for the electron injecting layer and electron transporting layer can be used in the invention:

(i) Oxadiazole derivatives represented by the following general formulas (16) to (18):

(16)

(17)

(18)

wherein $Ar^6$, $Ar^7$, $Ar^8$, $Ar^{10}$, $Ar^{11}$ and $Ar^{14}$ each represent a substituted or unsubstituted aryl group and may be the same as or different from each other, and $Ar^9$, $Ar^{12}$ and $Ar^{13}$ represent substituted or unsubstituted arylene groups and may be the same as or different from each other.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbon atoms, alkoxy groups with 1 to 10 carbon atoms, and a cyano group. The electron transferring compounds are preferably ones having capability of forming a thin film.

Specific examples of the electron transferring compounds include the following:

(ii) Nitrogen-containing heterocyclic derivatives represented by the following general formula (19):

(19)

wherein $A^7$ is a nitrogen atom or carbon atom; $R^5$ is an aryl group which has 6 to 60 carbon atoms and may have a substituent, a heteroaryl group which has 3 to 60 carbon atoms and may have a substituent, an alkyl group which has 1 to 20 carbon atoms, a haloalkyl group which has 1 to 20 carbon atoms, or an alkoxy group which has 1 to 20 carbon atoms; n is an integer of 0 to 4 and when n is an integer of 2 or more, $R^5$s may be the same as or different from each other or $R^5$s adjacent to each other may be bonded to each other to form a substituted or unsubstituted carbocyclic aliphatic ring or a substituted or unsubstituted carbocyclic aromatic ring; $Ar^{15}$ is an aryl group which has 6 to 60 carbon atoms and may have a substituent, or a heteroaryl group which has 3 to 60 carbon atoms and may have a substituent; $Ar^{16}$ is a hydrogen atom, an alkyl group which has 1 to 20 carbon atoms, a haloalkyl group which has 1 to 20 carbon atoms, an alkoxy group which has 1 to 20 carbon atoms, an aryl group which has 6 to 60 carbon atoms and may have a substituent, or a heteroaryl group which has 3 to 60 carbon atoms and may have a substituent (provided that either one of $Ar^{15}$ and $Ar^{16}$ is a condensed cyclic group which has 10 to 60 carbon atoms and may have a substituent or a condensed heterocyclic group which has 3 to 60 carbon atoms and may have a substituent); $L^1$ and $L^2$ are each a single bond, a condensed cyclic group which has 6 to 60 carbon atoms and may have a substituent, a condensed heterocyclic group which has 3 to 60 carbon atoms and may have a substituent, or a fluorenylene group which may have a substituent.

(iii) Nitrogen-containing heterocyclic derivatives represented by the following general formula (20):

$$HAr^{17}\text{-}L^3\text{-}Ar^{18}\text{—}Ar^{19} \quad (20)$$

wherein $HAr^{17}$ is a nitrogen-containing heterocyclic ring which has 3 to 40 carbon atoms and may have a substituent, $L^3$ is a single bond, an arylene group which has 6 to 60 carbon atoms and may have a substituent, a heteroarylene group which has 3 to 60 carbon atoms and may have a substituent, or a fluorenylene group which may have a substituent, $Ar^{18}$ is a bivalent aromatic hydrocarbon group which has 6 to 60 carbon atoms and may have a substituent, $Ar^{19}$ is an aryl group which has 6 to 60 carbon atoms and may have a substituent or a heteroaryl group which has 3 to 60 carbon atoms and may have a substituent.

(iv) Silacyclopentadiene derivatives represented by the following general formula (21):

wherein $X^2$ and $Y^1$ are each a saturated or unsaturated hydrocarbon group with 1 to 6 carbon atoms, an alkoxy group, an alkenyloxy group, an alkynyloxy group, a hydroxyl group, a substituted or unsubstituted aryl group, a substituted or unsubstituted heterocyclic group, or $X^2$ or $Y^1$ are bonded to each other to form a saturated or unsaturated ring; $R^6$ to $R^9$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or a substituted or unsubstituted fused ring structure formed by two adjacent substituents of $R^6$ to $R^9$: however, in the case where $R^6$ and $R^9$ are a phenyl group, $X^2$ and $Y^1$ are neither an alkyl group nor a phenyl group; in the case where $R^6$ and $R^9$ are a thienyl group, $X^2$, $Y^1$, $R^7$ and $R^8$ do not form the structure where $X^2$ and $Y^1$ are a monovalent hydrocarbon group, and at the same time $R^7$ and $R^8$ are an alkyl group, an aryl group, an alkenyl, or an aliphatic group with a cycle formed by $R^7$ and $R^8$ bonded; in the case where $R^6$ and $R^9$ are a silyl group, $R^7$, $R^8$, $X^2$ and $Y^1$ are each neither a monovalent hydrocarbon group with 1 to 6 carbon atoms nor a hydrogen atom; and in the case where $R^6$ and $R^7$ are bonded to form a condensed structure with a benzene ring, $X^2$ and $Y^1$ are neither an alkyl group nor a phenyl group.

(v) Borane derivatives represented by the following general formula (22):

wherein $R^{10}$ to $R^{17}$ and $Z^2$ are each a hydrogen atom, a saturated or unsaturated hydrocarbon group, an aromatic group, a heterocyclic group, a substituted amino group, a substituted boryl group, an alkoxy group or an aryloxy group; $X^3$, $Y^2$ and $Z^1$ are each a saturated or unsaturated hydrocarbon group, an aromatic group, a heterocyclic group, a substituted amino group, an alkoxy group or an aryloxy group; the substituent of $Z^1$ and $Z^2$ may be bonded to each other to form a condensed ring; n is an integer of 1 to 3, and $Z^1$s may be different from each other when n is 2 or more; however excluded are the compound where n is 1, $X^3$, $Y^2$ and $R^{11}$ are a methyl group and $R^{17}$ is a hydrogen atom or substituted boryl group, and the compound where n is 3 and $Z'$ is a methyl group.

(vi) Gallium compounds represented by the following general formula (23):

wherein $Q^1$ and $Q^2$ are a ligand represented by the following general formula (24) and include, but not limited to, quinoline residues such as 8-hydroxy-quinoline and 2-methyl-8-hydroxy-quinoline; $L^4$ is a halogen atom, a substituted or unsubstituted alkyl group, a substituted or unsubstituted cycloalkyl group, a substituted or unsubstituted aryl group, a substituted or unsubstituted heterocyclic group or —OR wherein R is a hydrogen atom, a substituted or unsubstituted alkyl group, a substituted or unsubstituted cycloalkyl group, a substituted or unsubstituted aryl group, a substituted or unsubstituted heterocyclic group or —O—Ga-Q³(Q⁴) wherein Q³ and Q⁴ are the same legand as Q¹ and Q²:

(24)

wherein rings B¹ and B² are each bonded to each other to form a substituted or unsubstituted arylic ring or a substituted or unsubstituted heterocyclic ring.

Specific examples of the rings B¹ and B² include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenyl and 3-trifluoromethylphenoxy; substituted or unsubstituted alkylthio groups such as methythio, ethylthio, tert-butylthio, hexylthio, octylthio and trifruoromethyltio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group, an amino group; mono or di-substituted amino groups such as methylamino, diethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl.

Moreover the above-mentioned substitutes may be bonded to each other to form a six-membered aryl or heterocyclic ring.

The metal complexes have the strong nature of an n-type semiconductor and large ability of injecting electrons. Further the energy generated at the time of forming a complex is small and a metal is then strongly bonded to ligands in the complex formed with a large fluorescent quantum efficiency.

In the invention, an electron injecting layer made of an insulator or a semiconductor may be further formed between its cathode and organic layer. At this time, leakage of electric current is effectively prevented so that the electron injecting property can be improved. It is preferred to use, as such an insulator, at least one metal compound selected from the group consisting of alkali metal calcogenides, alkaline earth metal calcogenides, halides of alkali metals, and halides of alkaline earth metals. It is preferred that the electron injecting layer is made of one or more out of these alkali metal calcogenides and the like since the electron injecting property thereof can be further improved. Specifically, preferred examples of the alkali metal calcogenides include $Li_2O$, LiO, $Na_2S$, $Na_2Se$ and NaO. Preferred examples of the alkaline earth metal calcogenides include CaO, BaO, SrO, BeO, BaS, and CaSe. Preferred examples of the halides of alkali metals include LiF, NaF, KF, LiCl, KCl, and NaCl. Preferred examples of the halides of alkaline earth metals include fluorides such as $CaF_2$, $BaF_2$, $SrF_2$, $MgF_2$, and $BeF_2$; and halides other than fluorides.

Examples of the semiconductor constituting the electron transporting layer may be one or any combination of two or more out of oxides, nitrides or oxynitrides containing at least one of Ba, Ca, Sr, Yb, Al, Ga, In, Li, Na, Cd, Mg, Si, Ta, Sb and Zn. The inorganic compound constituting the electron transporting layer preferably forms a microcrystalline or amorphous insulator thin film. If the electron transporting layer is made of the insulator thin film, the thin film becomes a more homogenous thin film. Therefore, pixel defects such as dark spots can be decreased. Examples of such an inorganic compound include the above-mentioned alkali metal calcogenides, alkaline earth metal calcogenides, halides of alkali metals, and halides of alkaline earth metals.

In the invention, a reducing dopant may be consisted in an interfacial region between its electron transferring region or cathode and its organic layer. The reducing dopant is defined as a substance which can reduce an electron transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

More specific examples of the preferred reducing dopants include at least one alkali metal selected from the group consisting of Na (work function: 2.36 eV), K (work function: 2.28 eV), Rb (work function: 2.16 eV) and Cs (work function: 1.95 eV), and at least one alkaline earth metal selected from the group consisting of Ca (work function: 2.9 eV), Sr (work function: 2.0 to 2.5 eV), and Ba (work function: 2.52 eV). Metals having a work function of 2.9 eV or less are in particular preferred. Among these, a more preferable reducing dopant is at least one alkali metal selected from the group consisting of K, Rb and Cs. Even more preferable is Rb or Cs. Most preferable is Cs.

These alkali metals are particularly high in reducing ability. Thus, the addition of a relatively small amount thereof to an electron injecting zone makes it possible to improve the luminance of the organic EL device and make the life time thereof long. As the reducing dopant having a work function of 2.9 eV or less, any combination of two or more out of these alkali metals is also preferred. Particularly preferred is any combination containing Cs, for example, a combination of Cs and Na, Cs and K, Cs and Rb, or Cs, Na and K. The combination containing Cs makes it possible to exhibit the reducing ability efficiently. The luminance of the organic EL device can be improved and the life time thereof can be made long by the addition thereof to its electron injecting zone.

[Insulator Layer]

In the organic EL device, pixel defects based on leakage or a short circuit are easily generated since an electric field is applied to the super thin film. In order to prevent this, it is preferred to insert an insulator thin layer between the pair of electrodes.

Examples of the material used in the insulator layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide.

In the invention, a mixture or laminate thereof may be used.

[Transparent Substrate]

The organic EL device of the invention is formed on a transparent substrate. The transparent substrate is a substrate for supporting the organic EL device, and is preferably a flat and smooth substrate having a transmittance of 50% or more to light rays within visible ranges of 400 to 700 nm.

Specific examples thereof include a glass plate and a polymer plate. Examples of the glass plate include soda-lime glass, barium/strontium-containing glass, lead glass, aluminosilicate glass, borosilicate glass, barium borosilicate glass, and quartz. Examples of the polymer plate include polycarbonate, acrylic polymer, polyethylene terephthalate, polyethersulfide, and polysulfone.

[Structure of the Organic EL Element]

Typical examples of the structure of the organic EL device (A) of the invention include the following:

(a) Anode/emitting layer/intermediate electrode layer/emitting layer/cathode, (b) Anode/hole injecting layer/emitting layer/intermediate electrode layer/emitting layer/cathode, (c) Anode/hole injecting layer/emitting layer/intermediate electrode layer/hole injecting layer/emitting layer/cathode, (d) Anode/emitting layer/electron injecting layer/intermediate electrode layer/emitting layer/electron injecting layer/cathode, (e) Anode/hole injecting layer/emitting layer/electron injecting layer/intermediate electrode layer/hole injecting layer/emitting layer/electron injecting layer/cathode, (f) Anode/hole injecting layer/hole transporting layer/emitting layer/electron injecting layer/intermediate electrode layer/hole injecting layer/hole transporting layer/emitting layer/electron injecting layer/cathode, (g) Anode/hole injecting layer/emitting layer/electron transporting layer/electron injecting layer/intermediate electrode layer/hole injecting layer/emitting layer/electron transporting layer/electron injecting layer/cathode, (h) Anode/hole injecting layer/hole transporting layer/emitting layer/electron transporting layer/electron injecting layer/intermediate electrode layer/hole injecting layer/hole transporting layer/emitting layer/electron transporting layer/electron injecting layer/cathode, (i) Anode/hole injecting layer/hole transporting layer/emitting layer/electron transporting layer/electron injecting layer/intermediate electrode layer/hole injecting layer/hole transporting layer/emitting layer/electron transporting layer/electron injecting layer/adhesion improving layer/cathode, (j) Anode/insulative layer/hole injecting layer/hole transporting layer/emitting layer/electron transporting layer/electron injecting layer/intermediate electrode layer/hole injecting layer/hole transporting layer/emitting layer/electron transporting layer/electron injecting layer/cathode, and (k) Anode/inorganic semiconductive layer/insulative layer/hole injecting layer/hole transporting layer/emitting layer/electron transporting layer/electron injecting layer/intermediate electrode layer/hole injecting layer/hole transporting layer/emitting layer/electron transporting layer/electron injecting layer/cathode.

[Examples of Producing an Organic EL Device]

The organic EL device can be produced by forming an anode and an emitting layer, optionally forming a hole injecting layer, an intermediate electrode layer and an electron injecting layer, and further forming a cathode by use of the materials and methods exemplified above. The organic EL device can be produced in the order reverse to the above, i.e., the order from a cathode to an anode.

An example of the production of the organic EL device will be described below which has a structure wherein the following are successively formed over a transparent substrate: anode/hole injecting layer/emitting layer/electron injecting layer/intermediate electrode layer/hole injecting layer/emitting layer/electron injecting layer/cathode.

First, a thin film made of an anode material is formed into a thickness of 1 µm or less, preferably 10 to 200 nm on an appropriate transparent substrate by vapor deposition, sputtering or some other method, thereby forming an anode.

Next, a hole injecting layer is formed on this anode. As described above, the hole injecting layer can be formed by vacuum deposition, spin coating, casting, LB technique, or some other method. Vacuum deposition is preferred since a homogenous film is easily obtained and pinholes are not easily generated. In the case where the hole injecting layer is formed by vacuum deposition, conditions for the deposition are varied in accordance with the used compound (the material for the hole injecting layer), the crystal structure or recombining structure of the hole injecting layer, and others. In general, the conditions are appropriately selected from the following: deposition source temperatures of 50 to 450° C., vacuum degrees of $10^{-7}$ to $10^{-3}$ torr, vapor deposition rates of 0.01 to 50 nm/second, substrate temperatures of −50 to 300° C., and film thicknesses of 5 nm to 5 µm.

Next, an emitting layer is formed on the hole injecting layer. The emitting layer can be formed by using a desired organic luminescent material and making the material into a thin film by vacuum deposition, sputtering, spin coating, casting or some other method. Of these methods, vacuum deposition is preferred since a homogenous film is easily obtained and pinholes are not easily generated. In the case where the emitting layer is formed by vacuum deposition, conditions for the deposition, which are varied dependently on the used compound, can be generally selected from conditions similar to those for the hole injecting layer.

Next, an electron injecting layer is formed on this emitting layer. Like the hole injecting layer and the emitting layer, the layer is preferably formed by vacuum deposition in order to obtain a homogenous film. Conditions for the deposition can be selected from conditions similar to those for the hole injecting layer and the emitting layer.

Next, an intermediate electrode layer is formed on the electron injecting layer. Furthermore a hole injecting layer is formed on the intermediate electrode layer.

These layers are preferably formed by vacuum deposition in order to obtain a homogenous film like the hole injecting layer and the emitting layer. Conditions for the deposition can be selected from conditions similar to those for the hole injecting layer and the emitting layer.

Next, an emitting layer and electron injecting layer are formed in a way similar to the above-mentioned way.

Lastly, a cathode is stacked thereon to obtain an organic EL device.

The cathode is made of a metal, and vapor deposition or sputtering may be used. However, vacuum deposition is preferred in order to protect underlying organic layers from being damaged when the cathode film is formed.

About the organic EL device production that has been described so far, it is preferred that the formation from the anode to the cathode is continuously carried out, using only one vacuuming operation.

The method for forming each of the layers in the organic EL device of the invention is not particularly limited. A forming method known, such as vacuum deposition or spin coating can be used.

The organic thin film layers in the organic EL device of the invention can be formed by vacuum deposition, molecular beam deposition (MBE method), or a known method of applying a solution wherein one or more, organic compounds are dissolved in a solvent, such as dipping, spin coating, casting, bar coating or roll coating.

The film thickness of each of the organic layers in the organic EL device of the invention is not particularly limited. In general, defects such as pinholes are easily generated when the film thickness is too small. Conversely, a high applied voltage becomes necessary to make the efficiency bad when the film thickness is too large. Usually, therefore, the film thickness is preferably in the range of several nanometers to one micrometer.

In the case where a DC voltage is applied to the organic EL device, luminescence can be observed when the polarity of the anode and that of the cathode are made positive and negative, respectively, and the voltage of 5 to 40 V is applied. Even if a voltage is applied thereto in the state that the polarities are reverse to the above, no electric current flows so that luminescence is not generated at all. In the case where an AC voltage is applied thereto, uniform luminescence can be observed only when the polarity of the anode and that of the cathode are made positive and negative, respectively. The waveform of the AC to be applied may be arbitrarily selected.

The organic EL device of the invention is preferably used for screens of various display equipment such as consumer TVs, large displays, and displays for cellular phones, illuminations and the like.

EXAMPLES

Examples of the invention will be described more specifically hereinafter. However, the invention is not limited to these examples.

Example 1

A glass substrate, 25 mm×75 mm×1.1 mm thick, having an ITO (thickness of 130 nm) transparent electrode (manufactured by Geomatics Co.) was subjected to ultrasonic cleaning in isopropyl alcohol for 5 minutes, ultrasonic cleaning in distilled water having an electric resistance of 20 MΩm for 5 minutes, and then ultrasonic cleaning in isopropyl alcohol for 5 minutes. The resultant ITO substrate was taken out, dried, and immediately subjected to UV ozone cleaning for 30 minutes with a UV ozone equipment manufactured by Samco International Laboratory.

The cleaned glass substrate having transparent electrode lines was set up on a substrate holder in a vacuum deposition device. Then, vacuuming was carried out to $1\times10^{-5}$ Pa.

First, an N,N'-bis(N,N'-diphenyl-4-aminophenyl)-N,N-diphenyl-4,4'-diamino-1,1'-biphenyl film (hereinafter referred to as TPD 232 film) was formed into a film in thickness of 60 nm on the surface on which the transparent electrode lines were formed at a deposition rate of 0.1 nm/sec, so as to cover the transparent electrode. The TPD 232 film functioned as a hole injecting layer.

TPD232

After the formation of the TPD 232 film, an N,N,N',N'-tetra (4-biphenyl)-diaminobiphenylene layer (hereinafter referred to as TBDB) having a film thickness of 20 nm was formed on the TPD 232 film at a deposition rate of 0.1 nm/sec. This film functioned as a hole transporting layer.

TBDB

Furthermore, a host (hereinafter referred to as H1) was deposited at a deposition rate of 0.2 nm/sec, thereby forming a layer having a thickness of 40 nm on the TBDP film. At this time, as a luminescent molecule, a dopant (hereinafter referred to as D1) was deposited at a deposition rate of 0.01 nm/sec. This layer functioned as the emitting layer.

H1

D1

As an electron injecting layer, Alq and Li were deposited at deposition rates of 0.1 nm/sec and 0.01 nm/sec respectively to form a 20 nm thick film. As an intermediate electrode layer, Cs and MoO$_x$ (x is 2 to 3) were co-deposited at deposition rates of 0.01 nm/sec and 0.1 nm/sec respectively to form a 1 nm thick film thereon.

Alq

Next, TPD232, TBDB, H1 and D1, Alq and Li, Cs and MoO$_x$, TPD232, TBDB, H1 and D1, and Alq and Li were similarly formed sequentially.

Furthermore, Al metal was deposited at a deposition rate of 0.8 nm/sec to form a metal cathode, thereby obtaining an organic EL device. The organic EL device contained a total of three emitting layers.

Next, the initial performance of this organic EL device was measured. The results were a driving voltage of 15.0 V, 30 cd/A, and CIEx,y=(0.14, 0.25) at a current density of 1 mA/cm$^2$.

The life time was measured and evaluated at room temperature by driving with a constant direct current. At this time a current was adjusted to the current value at the time of an initial luminance of 3000 nit and the current was continuously applied. A half-life is a period of time until the initial luminance was reduced by half. Moreover a voltage increase during the half-life is the difference in voltage between at the beginning of driving and at the time of reduction by half.

Example 2

An organic EL device was produced in the same manner as in Example 1 except that, as an intermediate electrode layer, Cs and TCNQ were co-deposited at deposition rates of 0.01 nm/sec and 0.1 nm/sec respectively, thereby forming a 1 nm thick film. The performance thereof was evaluated. The results are shown in Table 1.

Comparative Example 1

An organic EL device was produced in the same manner as in Example 1 except that, as an intermediate electrode layer, ITO was sputtered at a deposition rate of 0.4 nm/sec, thereby forming a 10 nm thick film. The performance thereof was evaluated. The results are shown in Table 1.

Comparative Example 2

An organic EL device was produced in the same manner as in Example 1 except that TPD232, TBDB, H1 and D1, and Alq and Li films were formed sequentially, and then an Al film was formed: the number of stacking was one. The performance thereof was evaluated. The results are shown in Table 1.

Example 3

An organic EL device was produced in the same manner as in Example 1 except that, instead of Cs and MoO$_x$, Li, Zn and Se were co-deposited at deposition rates of 0.01 nm/sec respectively as an intermediate electrode layer, thereby forming a 1 nm thick film. The performance thereof was evaluated. The results are shown in Table 1.

Example 4

An organic EL device was produced in the same manner as in Example 1 except that only Alq was deposited to form a 20 nm thick film as an electron injecting layer; CsTe was deposited at a deposition rate of 0.1 nm/sec to form a 1 nm thick film as an intermediate electrode layer instead of Cs and MoO$_x$; and then MoO$_x$ (x is 2 to 3) was deposited at a deposition rate of 0.1 nm/sec to form a 5 nm thick film thereon. The performance thereof was evaluated. The results are shown in Table 1.

Comparative Example 3

An organic EL device was produced in the same manner as in Example 1 except that, instead of Cs and MoO$_x$, V$_2$O$_5$ was deposited at a deposition rate of 0.01 nm/sec as an intermediate electrode layer, thereby forming a 1 nm thick film. The performance thereof was evaluated. The results are shown in Table 1.

As a result of life time measurement, a voltage increase during the half-life was larger in this comparative example than in Example 1.

Example 5

An organic EL device was produced in the same manner as in Comparative example 2 except that Ag and ITO were stacked on a substrate with the thickness of Ag film being 20 nm; TPD232, TBDP, and H1 and D1 films were formed sequentially on the ITO film in the same manner as in Comparative example 2; an Alq film was formed in a thickness of 20 nm thereon as an electron transporting layer; Cs and MoO$_3$ were co-deposited as a cathode at deposition rates of 0.01 nm/sec and 0.02 nm/sec respectively to form a 1.0 nm thick film wherein the volume ratio of Cs to MoO$_3$ was 0.3 to 0.7 thereon; and then MoO$_3$ was deposited at a deposition rate of 0.02 nm/sec to form a 100 nm thick film thereon.

The initial performance of the organic EL device obtained was a current density of 1 mA/cm$^2$, a luminance of 110 nit, a chromaticity of (0.16, 0.26) and a current efficiency of 11 cd/A at a driving voltage of 4.5 V. At this time, the half-life of luminance at an initial luminance of 3,000 nit was 2,500 hr.

Comparative Example 4

An organic EL device was produced in the same manner as in Example 5 except that Mg and Ag were co-deposited as a cathode at deposition rates of 1.5 nm/sec and 0.1 nm/sec respectively to form a 1.6 nm thick film wherein the volume ratio of Mg to Ag was 1.5 to 0.1, and ITO was deposited at a deposition rate of 0.4 nm/sec to form a 100 nm thick film thereon.

The initial performance of the organic EL device obtained was a current density of 1 mA/cm$^2$, a luminance of 80 nit, a chromaticity of (0.16, 0.26) and a current efficiency of 8 cd/A at a driving voltage of 6.0 V. At this time, the half-life of luminance at an initial luminance of 3,000 nit was 1,200 hr.

Example 6

An organic EL device was produced in the same manner as in Comparative example 2 except that Cs and MoO$_3$ were co-deposited as a bipolar charge injection layer at deposition rates of 0.01 nm/sec and 0.09 nm/sec respectively to form a 1.0 nm thick film wherein the volume ratio of Cs to MoO$_3$ was 0.3 to 0.7 between ITO and TPD232 layers; a layer of Al only was formed in a thickness of 20 nm instead of the layer of co-deposited Alq and Li; and then Cs and MoO$_3$ were co-deposited at deposition rates of 0.01 nm/sec and 0.09 nm/sec in thickness of 0.1 nm and 0.9 nm respectively between the Alq and Al layers.

The initial performance of the organic EL device obtained was a current density of 1 mA/cm$^2$, a luminance of 110 nit, a chromaticity of (0.16, 0.26) and a current efficiency of 11 cd/A at a driving voltage of 4.5 V. At this time, the half-life of luminance at an initial luminance of 3,000 nit was 2,500 hr.

INDUSTRIAL APPLICABILITY

The invention provides an organic EL device with a high efficiency and long life time, and a display using the same.

The invention claimed is:

1. An organic electroluminescent device comprising:
   at least two or more emitting layers between an anode and a cathode, and
   an intermediate electrode layer being interposed between emitting layers,
   the intermediate electrode layer being a single layer or a multilayer structure, at least one of the layers comprising a semiconductive material and at least one of the layers comprising a donor that is an alkali metal and/or an alkaline earth metal,
   the semiconductive material comprising an acceptor that is at least one conductive oxide comprising a transition metal selected from the group consisting of NbO$_x$, LaO$_x$, NdO$_x$, SmO$_x$, EuO$_x$, MoO$_x$, WO$_x$, OsO$_x$, IrO$_x$ and PtO$_x$, wherein x is 0.2 to 5;
   wherein the acceptor is the main constituent of the intermediate electrode layer and the ratio of donor to acceptor in the intermediate electrode layer is between 2:98 to 20:80 by weight.

2. A display comprising a screen comprising the organic electroluminescent device according to claim 1.

3. The organic electroluminescent device according to claim 1, wherein the conductive oxide is MoO$_x$.

4. The organic electroluminescent device according to claim 1, wherein the conductive oxide is MoO$_x$, x is 2 to 3, and the donor is Cs.

5. The organic electroluminescent device according to claim 1, further comprising an electron injecting layer on the anode side of the intermediate layer, wherein the electron injecting layer comprises an alkali metal compound or a reducing dopant.

6. The organic electroluminescent device according to claim 1, wherein the intermediate electrode layer has a resistivity between 0.001 and 10,000 Ω·cm.

TABLE 1

| | Driven at 1 mA/cm$^2$ | | | Life time measurement at initial luminance of 3,000 nit | | Leakage current at −5 V of reverse bias (A/cm$^2$) | Intermediate electrode layer | Resistivity of intermediate electrode layer (Ω·cm) |
|---|---|---|---|---|---|---|---|---|
| | Voltage (V) | L/J (cd/A) | CIEx, y | Half-life (h) | Voltage increase during half-life (V) | | | |
| Example 1 | 15.0 | 30 | 0.14, 0.25 | 10000 | 2.5 | 1 × 10$^{-9}$ | CsMoO$_x$ | 0.1 |
| Example 2 | 15.5 | 28 | 0.14, 0.24 | 9000 | 2.5 | 1 × 10$^{-9}$ | CsTCNQ | 5.0 |
| Comparative Example 1 | 15.0 | 29 | 0.14, 0.26 | 3000 | 5.0 | 2 × 10$^{-7}$ | ITO | 3 × 10$^{-4}$ |
| Comparative Example 2 | 5.0 | 10 | 0.16, 0.26 | 2000 | 1.0 | 5 × 10$^{-9}$ | none | — |
| Comparative Example 3 | 16.0 | 28 | 0.16, 0.26 | 7000 | 8.0 | 5 × 10$^{-9}$ | VO$_x$ | 10$^5$ |
| Example 3 | 15.0 | 30 | 0.14, 0.25 | 9000 | 2.5 | 2 × 10$^{-9}$ | LiZnSe | 1 |
| Example 4 | 13.0 | 30 | 0.14, 0.25 | 9000 | 2.5 | 1 × 10$^{-9}$ | CsTe•MoO$_x$ | 0.2 |
| Example 5 | 4.5 | 11 | 0.16, 0.26 | 2500 | 0.8 | 3 × 10$^{-9}$ | none | — |
| Comparative Example 4 | 6.0 | 8.0 | 0.16, 0.26 | 1200 | 2.0 | 1 × 10$^{-6}$ | none | — |
| Example 6 | 4.5 | 11 | 0.16, 0.26 | 2500 | 0.9 | 3 × 10$^{-9}$ | none | — |

7. The organic electroluminescent device according to claim 1, wherein the intermediate electrode layer has a resistivity between 0.01 and 100 Ω·cm.

8. An organic electroluminescent device comprising:
- at least two or more emitting layers between an anode and a cathode, and
- an intermediate electrode layer being interposed between emitting layers,
- the intermediate electrode layer being a single layer or a multilayer structure, at least one of the layers comprising a semiconductive material and at least one of the layers comprising a donor that is an alkali metal and/or an alkaline earth metal, and
- the semiconductive material comprising $MoO_x$, wherein x is 0.2 to 5.

* * * * *